United States Patent
Kim (10) Patent No.: US 10,037,819 B2
(45) Date of Patent: Jul. 31, 2018

(54) SEMICONDUCTOR MEMORY DEVICE AND REFRESH METHOD OF SEMICONDUCTOR MEMORY DEVICE

(71) Applicant: SK hynix Inc., Icheon-si, Gyeonggi-do (KR)

(72) Inventor: Jae Il Kim, Yongin-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 15/484,244

(22) Filed: Apr. 11, 2017

(65) Prior Publication Data

US 2017/0352400 A1 Dec. 7, 2017

(30) Foreign Application Priority Data

Jun. 1, 2016 (KR) .................. 10-2016-0068098

(51) Int. Cl.
| | |
|---|---|
| *G11C 11/402* | (2006.01) |
| *G11C 29/00* | (2006.01) |
| *G11C 11/406* | (2006.01) |
| *G11C 8/08* | (2006.01) |
| *G11C 29/52* | (2006.01) |

(52) U.S. Cl.
CPC .............. *G11C 29/783* (2013.01); *G11C 8/08* (2013.01); *G11C 11/40611* (2013.01); *G11C 29/52* (2013.01); *G11C 11/402* (2013.01)

(58) Field of Classification Search
CPC .................................................. G11C 11/402
USPC ............................................................ 365/203
See application file for complete search history.

(56) References Cited

U.S. PATENT DOCUMENTS

2013/0272082 A1* 10/2013 Kim ...................... G11C 11/402
365/203

FOREIGN PATENT DOCUMENTS

| KR | 100821583 B1 | 4/2008 |
|---|---|---|
| KR | 1020150067787 A | 6/2015 |

* cited by examiner

*Primary Examiner* — Jason Lappas
(74) *Attorney, Agent, or Firm* — William Park & Associates Ltd.

(57) ABSTRACT

A semiconductor memory device may include a row address generating circuit, a row active pulse generating circuit and a word line activating circuit. The row address generating circuit may generate a row address in response to a refresh command, a row active pulse, and a normal address. The row active pulse generating circuit may generate a row active pulse in response to a refresh signal and an active signal. The word line activating circuit may selectively enable a word line in response to the row address and the row active pulse.

18 Claims, 6 Drawing Sheets

SEMICONDUCTOR MEMORY DEVICE AND REFRESH METHOD OF SEMICONDUCTOR MEMORY DEVICE

CROSS-REFERENCES TO RELATED APPLICATION

The present application claims priority under 35 U.S.C. § 119(a) to Korean application number 10-2016-0068098 filed on Jun. 1, 2016, in the Korean Intellectual Property Office, which is incorporated herein by reference in its entirety.

BACKGROUND

1. Technical Field

Various embodiments generally relate to a semiconductor integrated circuit device, and more particularly to a semiconductor memory device and a refresh method of the semiconductor memory device.

2. Related Art

A semiconductor memory device is a data storage device implemented on a semiconductor integrated circuit. The semiconductor memory device is often used as computer memory because data can be written to or read from the semiconductor memory device within a very short time.

The semiconductor memory device may be classified into a volatile memory device and a non-volatile memory device. The non-volatile memory device can retain its data even when power is shut off or interrupted. The volatile memory device, contrary to the volatile memory device, is a memory device that requires power to retain the stored data.

In addition, it may be required for the volatile memory device to have their data periodically refreshed in order to maintain their memory contents.

SUMMARY

According to an embodiment, a semiconductor memory device may include a row address generating circuit, a row active pulse generating circuit, and a word line activating circuit. The row address generating circuit may generate a row address in response to a refresh command, a row active pulse, and a normal address. The row active pulse generating circuit may generate a row active pulse in response to a refresh signal and an active signal. The word line activating circuit may selectively enable a word line in response to the row address and the row active pulse.

According to an embodiment, a refresh method of a semiconductor memory device that replaces a pair of normal word lines with a pair of redundancy word lines and includes a refresh address counter configured to sequentially count addresses of the normal word lines may include enabling a first pulse of a refresh signal. The refresh method of a semiconductor memory device may include performing a refresh redundancy check with respect to the address of the pair of the normal word lines during a period of time during which the first pulse of the refresh signal is enabled. The refresh method of a semiconductor memory device may include enabling a second pulse of the refresh signal. The refresh method of a semiconductor memory device may also include performing a refresh operation without performing the refresh redundancy check during a period of time during which the second pulse of the refresh signal is enabled.

DETAILED DESCRIPTION

Various example embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

A semiconductor memory device of this example embodiment may perform a refresh redundancy check operation with respect to a word line that may perform a refresh operation when a refresh signal may be inputted into the semiconductor memory device. After performing the refresh redundancy check operation, the semiconductor memory device may enable the word line to perform the refresh operation. The refresh redundancy check operation may identify whether the word line for performing the refresh operation may correspond to a redundancy word line or not. The refresh redundancy check operation may prevent data collisions between a redundancy memory cell and a normal memory cell.

Figure 1:
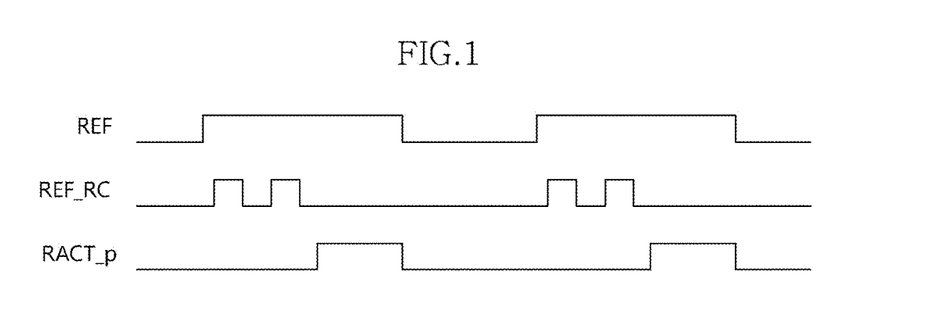
FIG. 1 is a timing diagram illustrating an example of a refresh method of a semiconductor memory device in accordance with example embodiments.

FIG. 1 is a timing diagram illustrating an example of a refresh method of a semiconductor memory device in accordance with example embodiments.

Referring to FIG. 1, when a refresh signal REF is enabled, a refresh redundancy check pulse REF_RC may be generated. After two pulses of the refresh redundancy check pulse REF_RC are generated, a row active pulse RACT_p may be generated.

A semiconductor memory device may perform a refresh operation on a word line during a period of time when the refresh signal REF is enabled. When the refresh signal REF is enabled, it may be determined whether the word line to be refreshed (i.e., the word line coupled to the memory cell to be refreshed) is one that has been replaced by a redundant word line (hereinafter referred to as "redundancy word line"). In an embodiment, a plurality of the word lines may be determined if they are the redundancy word lines. For example, in response to two consecutively generated pulses of the refresh redundancy check pulse REF_RC, it may be determined whether two word lines to be refreshed are the redundancy word lines. In order to check whether the two word lines are the redundancy word lines or not, the two refresh redundancy check pulses REF_RC may be generated. The two refresh redundancy check pulses REF_RC may include addresses of the word lines to be refreshed.

After the two refresh redundancy check pulses REF_RC are continuously generated, the row active pulse RACT_p may be enabled. Thus, a refresh may be performed during a period of time during which the row active pulse RACT_p is enabled. To put it another way, the refresh may be performed during a period of time during which the refresh signal REF is enabled except for a period of time during which the two refresh redundancy check pulses REF_RC are generated.

The semiconductor memory devices are shrinking in size to maximize the memory capacity, and thus a period of time during which the refresh operations need to be completed continuously decreases because more and more memory cells need to be refreshed within a limited period of time. However, the refresh redundancy check operation may negatively affect the time available for the actual refresh operation. Thus, the refresh redundancy check may reduce the amount of time required for the actual refresh, or may increase a time for the whole refresh operation.

Figure 2:
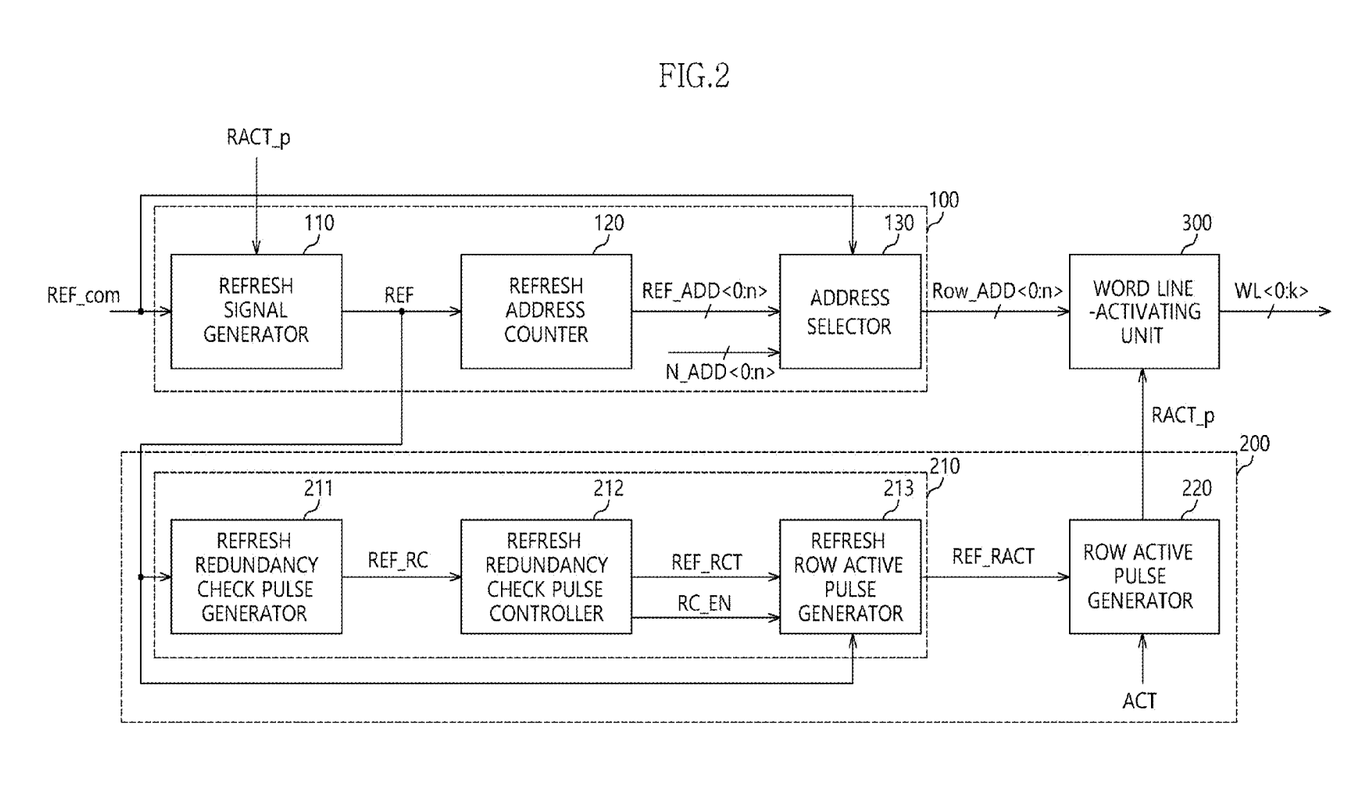
FIG. 2 is a diagram illustrating an example of a semiconductor memory device in accordance with example embodiments.

FIG. 2 is a diagram illustrating an example of a semiconductor memory device in accordance with example embodiments.

Referring to FIG. 2, a semiconductor memory device may include a row address generating circuit 100, a row active pulse generating circuit 200, and a word line activating circuit 300.

The row address generating circuit 100 may generate a row address Row_ADD<0:n> in response to a refresh command REF_com, a row active pulse RACT_p, and a normal address N_ADD<0:n>. For example, the row address generating circuit 100 may include a counter that sequentially counts row addresses from a certain row of memory cells. The row address generating circuit 100 may output counted addresses as the row address Row_ADD<0:n> in response to the refresh command REF_com and the row active pulse RACT_p, or may output the normal address N_ADD<0:n> as the row address Row_ADD<0:n> in response to the refresh command REF_com.

The row address generating circuit 100 may include a refresh signal generator 110, a refresh address counter 120, and an address selector 130.

The refresh signal generator 110 may generate the refresh signal REF in response to the refresh command REF_com and the row active pulse RACT_p. For example, the refresh signal generator 110 may enable the refresh signal REF in response to the refresh command REF_com. The refresh signal generator 110 may disable the refresh signal REF in response to the row active pulse RACT_p.

The refresh address counter 120 may perform a count operation in response to the refresh signal REF to generate a refresh address REF_ADD<0:n>.

The address selector 130 may output one of the refresh address REF_ADD<0:n> and the normal address N_ADD<0:n> in response to the refresh command REF_com. For example, the address selector 130 may output the refresh address REF_ADD<0:n> as the row address Row_ADD<0:N> in response to the refresh command REF_com when the refresh operation is performed. In contrast, the address selector 130 may output the normal address N_ADD<0:n> as the row address Row_ADD<0:n> in response to the refresh command REF_com when the refresh operation is not be performed.

The row active pulse generating circuit 200 may generate the row active pulse RACT_p in response to the refresh signal REF and an active signal ACT. For example, the row active pulse generating circuit 200 may generate the row active pulse RACT_p in response to the refresh signal REF. The row active pulse generating circuit 200 may generate the row active pulse RACT_p in response to the active signal ACT.

The row active pulse generating circuit 200 may include a refresh pulse generator 210 and a row active pulse generator 220.

The refresh pulse generator 210 may generate a refresh row active signal REF_RACT in response to the refresh signal REF. In an embodiment, it is assumed that the refresh signal REF is a relatively wide pulse compared to the row active pulse RACT_p and the refresh row active signal REF_RACT, and two consecutive wide pulses of the refresh signal REF may be generated. For example, when the refresh signal REF is enabled for the first time (i.e., when a first pulse of the refresh signal REF is enabled), the refresh pulse generator 210 may enable the refresh row active signal REF_RACT after a predetermined time. When the refresh signal REF is enabled for the second time (i.e., when a second pulse of the refresh signal REF is enabled), the refresh pulse generator 210 may enable the refresh row active signal REF_RACT just after the refresh signal is enabled for the second time (e.g., after a second pulse of the refresh signal REF is enabled).

The row active pulse generator 220 may generate the row active pulse RACT_p in response to the refresh row active signal REF_RACT and the active signal ACT. For example, when the refresh row active signal REF_RACT or the active signal ACT is enabled, the row active pulse generator 220 may enable the row active pulse RACT_p.

The refresh pulse generator 210 may include a refresh redundancy check pulse generator 211, a refresh redundancy check pulse controller 212, and a refresh row active pulse generator 213.

The refresh redundancy check pulse generator 211 may generate a redundancy check pulse REF_RC in response to the refresh signal REF. For example, the refresh redundancy check pulse generator 211 may consecutively generate the redundancy check pulses REF_RC when the refresh signal REF is enabled. For example, when the refresh signal REF may is enabled, the refresh redundancy check pulse generator 211 may generate two consecutive redundancy check pulses REF_RC.

The refresh redundancy check pulse controller 212 may generate a redundancy check control pulse REF_RCT in response to the refresh signal REF and the redundancy check pulse REF_RC. For example, the refresh redundancy check pulse controller 212 may output the redundancy check pulse REF_RC as the redundancy check control pulse REF_RCT during a period of time during which the refresh signal REF is enabled for the first time (i.e., when the first pulse of the refresh signal REF is enabled). The refresh redundancy check pulse controller 212 may fix the redundancy check control pulse REF_RCT to a certain level during a period of time during which the refresh signal REF is enabled for the second time (i.e., when the second pulse of the refresh signal REF is enabled). The refresh redundancy check pulse controller 212 may transition a voltage level of a redundancy check enabling signal RC_EN when the refresh signal REF is disabled. For example, the refresh redundancy check pulse controller 212 may disable the redundancy check enabling signal RC_EN when the refresh signal REF is disabled for the first time, and may enable the redundancy check enabling signal RC_EN when the refresh signal REF is disabled for the second time.

The refresh row active pulse generator 213 may generate the refresh row active signal REF_RACT in response to the refresh signal REF, the redundancy check control pulse REF_RCT, and the redundancy check enabling signal RC_EN. For example, the refresh row active pulse generator 213 may enable the refresh row active signal REF_RACT when the refresh redundancy check control pulse REF_RCT is input for a predetermined number of times during a period of time during which the redundancy check enabling signal RC_EN is enabled. For example, the refresh row active pulse generator 213 may enable the refresh row active signal REF_RACT when two pulses of the refresh redundancy check control pulse REF_RCT are input during a period of time during which the redundancy check enabling signal RC_EN is enabled. The refresh row active pulse generator 213 may enable the refresh row active signal REF_RACT when the refresh signal REF is enabled during a period of time during which the redundancy check enabling signal RC_EN is disabled.

Figure 3:
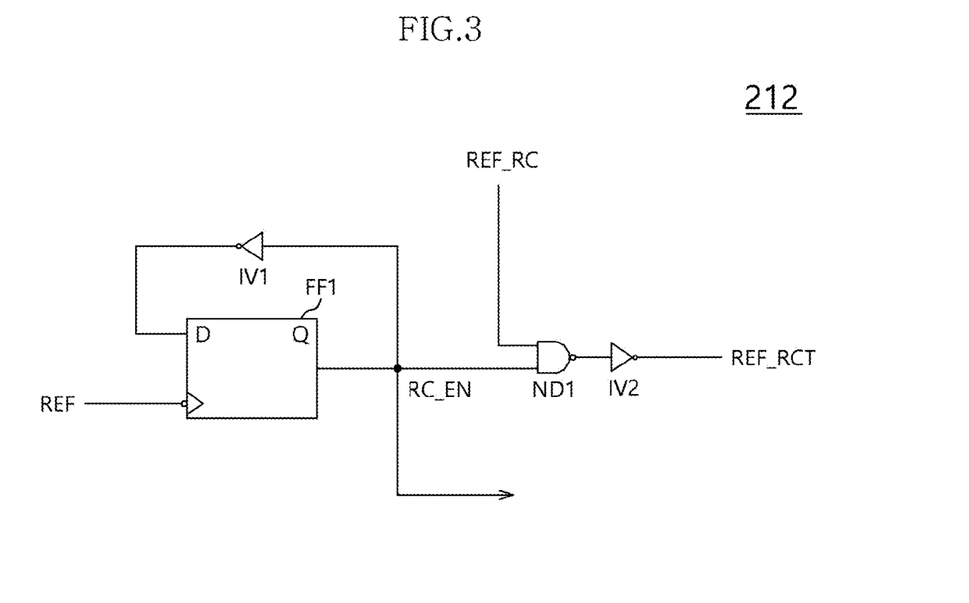
FIG. 3 is a diagram illustrating an example of a refresh redundancy check pulse control circuit of the semiconductor memory device illustrated in FIG. 2.

FIG. 3 is a diagram illustrating an example of a refresh redundancy check pulse control circuit of the semiconductor memory device illustrated in FIG. 2.

Referring to FIG. 3, the refresh redundancy check pulse controller 212 may include a flip-flop FF1, a first inverter IV1, a second inverter IV2, and an NAND gate ND1.

The flip-flop FF1 may latch an input signal when the refresh signal REF is disabled. The flip-flop FF1 may output the latched signal. The first inverter IV1 may receive the output signal from the flip-flop FF1. The first inverter IV1 may output a signal as an input signal of the flip-flop FF1. The output signal of the flip-flop FF1 may be output as the redundancy check enabling signal RC_EN. The NAND gate ND1 may receive the redundancy check enabling signal RC_EN and the refresh redundancy check pulse REF_RC. The second inverter IV2 may receive an output signal from the NANA gate ND1. The second inverter IV2 may output the refresh redundancy check control pulse REF_RCT.

Figure 4:
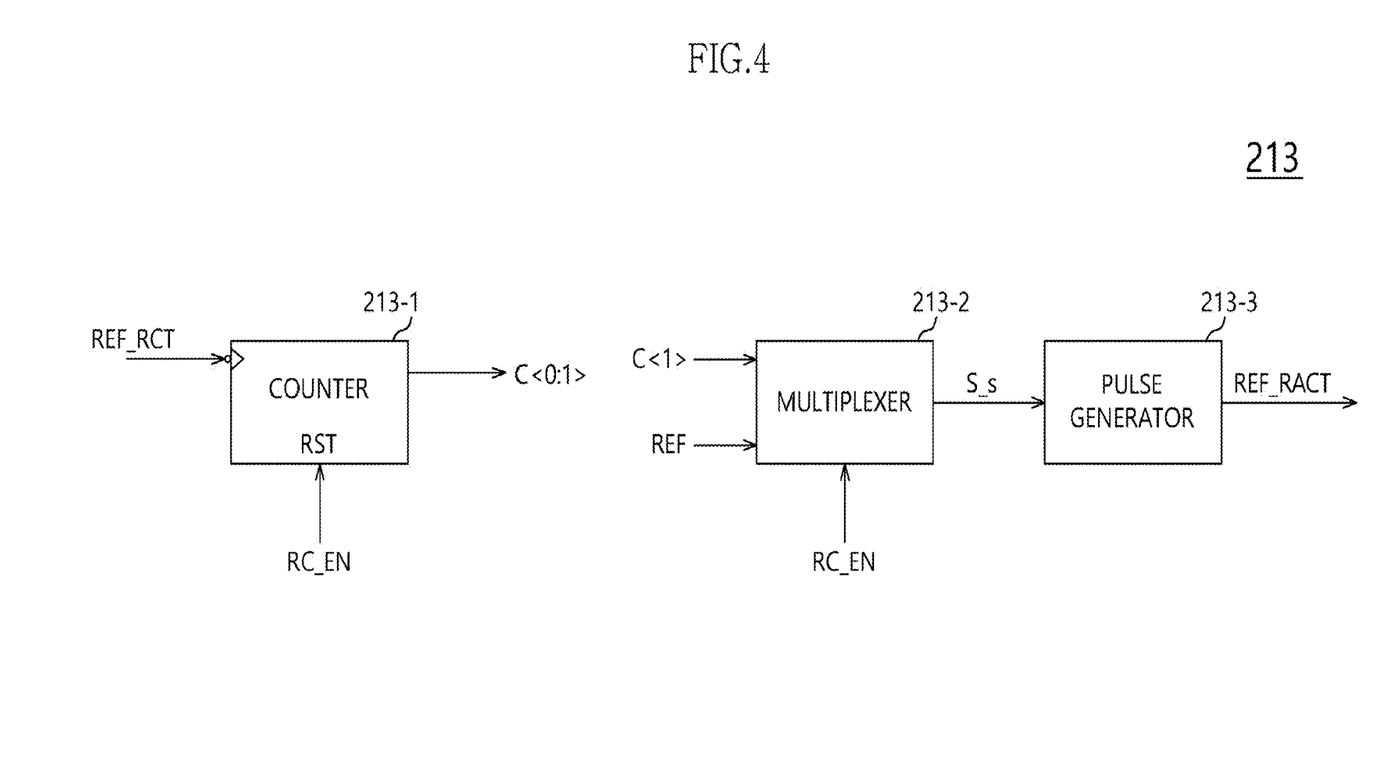
FIG. 4 is a diagram illustrating an example of a refresh row active pulse generating circuit of the semiconductor memory device illustrated in FIG. 2.

FIG. 4 is a diagram illustrating an example of a refresh row active pulse generating circuit of the semiconductor memory device illustrated in FIG. 2.

Referring to FIG. 4, the refresh row active pulse generator 213 may include a counter 213-1, a multiplexer 213-2, and a pulse generator 213-3.

The counter 213-1 may count a counter signal C<0:1> when the refresh redundancy check control pulse REF_RCT is disabled during a period of time during which the redundancy check enabling signal RC_EN is enabled. The counter 213-1 may initialize the counter signal C<0:1> during a period of time during which the redundancy check enabling signal RC_EN is disabled. For example, the counter signal C<0:1> may have zero (0) and one (1) when the refresh redundancy check control pulse REF_RCT is disabled for the second time during a period of time during which the redundancy check enabling signal RC_EN is disabled. Here, the counter signal C<1> may be one (logic high value).

The multiplexer 213-2 may output one of the counter signal C<1> and the refresh signal REF as a selection signal S_s in response to the redundancy check enabling signal RC_EN. For example, the multiplexer 213-2 may output the counter signal C<1> as the selection signal S_s when the redundancy check enabling signal RC_EN is enabled. The multiplexer 213-2 may output the refresh signal REF as the selection signal S_s when the redundancy check enabling signal RC_EN is disabled.

The pulse generator 213-3 may generate the refresh row active signal REF_RACT in response to the selection signal S_s. For example, the pulse generator 213-3 may generate the refresh row active signal REF_RACT when the selection signal S_s is enabled.

When the redundancy check enabling signal RC_EN is enabled, the refresh row active pulse generator 213 may enable the refresh row active signal REF_RACT after receiving two pulses of the refresh redundancy check control pulse REF_RCT. When the redundancy check enabling signal RC_EN is disabled, the refresh row active pulse generator 213 may enable the refresh row active signal REF_RACT just after the refresh signal REF is enabled.

The word line activating circuit 300 may selectively enable the word line WL<0:K> in response to the row active pulse RACT_p and the row address Row_ADD<0:n>. For example, the word line activating circuit 300 may selectively enable the word line WL<0:K> in response to the row address Row_ADD<0:n> during a period of time during which the row active pulse RACT_p is enabled.

Figure 5:
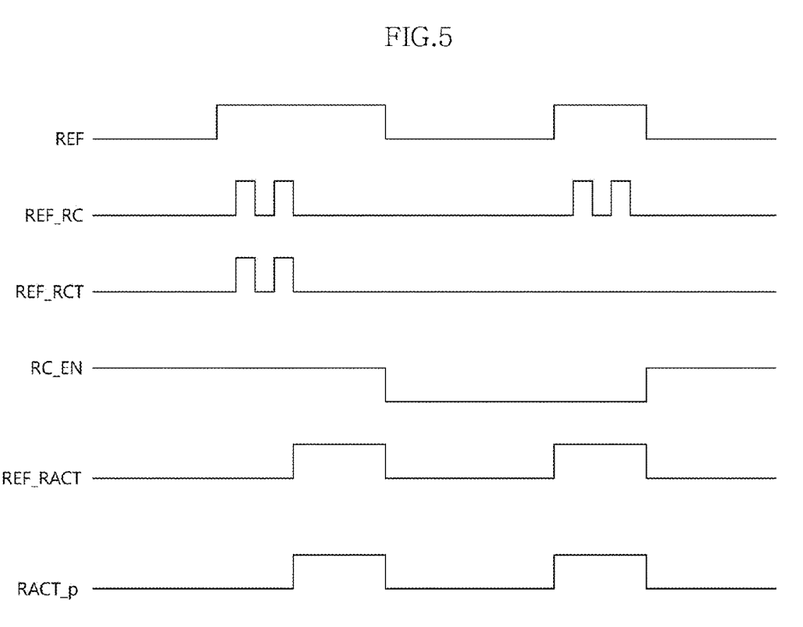
FIG. 5 is a timing diagram illustrating an example of a refresh method of the semiconductor memory device illustrated in FIG. 2.

FIG. 5 is a timing diagram illustrating an example of a refresh method of the semiconductor memory device illustrated in FIG. 2.

Referring to FIG. 5, the refresh redundancy check pulse generator 211 may consecutively generate the two refresh redundancy check pulses REF_RC when the refresh signal REF is enabled.

In an embodiment, it is assumed that the refresh signal REF is a relatively wide pulse compared to the row active pulse RACT_p and the refresh row active signal REF_RACT, and two consecutive wide pulses of the refresh signal REF may be generated. When the refresh signal REF is disabled for the first time (i.e., when a first pulse of the refresh signal REF is disabled), the enabled redundancy check enabling signal RC_EN may be disabled. When the refresh signal REF is disabled for the second time (i.e., when a second pulse of the refresh signal REF is disabled), the disabled redundancy check enabling signal RC_EN may be enabled.

The refresh redundancy check pulse controller 212 may output the refresh redundancy check pulse REF_RC as the refresh redundancy check control pulse REF_RCT during a period of time during which the refresh signal REF is enabled for the first time (i.e., during a period of time during which the first pulse of the refresh signal REF is enabled). That is, the refresh redundancy check pulse REF_RC may be output as the refresh redundancy check control pulse REF_RCT during a period of time during which the redundancy check enabling signal RC_EN is enabled.

The refresh redundancy check control pulse REF_RCT may be fixed to a certain level (e.g., a low level) during a period of time during which the refresh signal REF is enabled for the second time (i.e., during a period of time during which the second pulse of the refresh signal REF is enabled). That is, the refresh redundancy check control pulse REF_RCT may be fixed to the low level during a period of time during which the redundancy check enabling signal RC_EN is disabled.

The refresh row active signal REF_RACT may be enabled after the two refresh redundancy check control pulses REF_RCT are consecutively generated during a period of time during which the first pulse of the refresh signal REF is enabled, i.e., during a period of time during which the redundancy check enabling signal RC_EN is enabled. The refresh row active signal REF_RACT may be enabled when the refresh signal REF is enabled during a period of time during which the second pulse of the refresh signal REF is enabled, i.e., during a period of time during which the redundancy check enabling signal RC_EN is disabled.

As mentioned above, the row active pulse RACT_p may be generated whenever the refresh row active signal REF_RACT is enabled.

When the two refresh operations are consecutively performed, the first refresh operation may perform the refresh redundancy check. In contrast, the second refresh operation may not perform the refresh redundancy check. Therefore, a sufficient refresh time may be secured during the secondary refresh operation. Further, the secondary refresh operation may be performed faster than the primary refresh operation.

In an embodiment, two pulses of the refresh signal REF may be consecutively generated. When the first pulse of the refresh signal REF is enabled (e.g., at a high level), the two refresh redundancy check pulses REF_RC may be consecutively generated. The refresh redundancy check pulses REF_RC may include the address of the word line to be refreshed (i.e., the word line coupled to the memory cell to be refreshed) during a period of time during which the refresh signal REF is enabled. The semiconductor memory device may generate the address of the word line using the refresh address counter 120. After the two consecutive refresh redundancy check control pulse REF_RCT are generated during a period of time during which the first pulse of the refresh signal REF is enabled, the row active pulse RACT_p may be enabled.

When the second pulse of the refresh signal REF is enabled (e.g., at the high level), the refresh redundancy check control pulse REF_RCT may not be generated. The row active pulse RACT_p may be enabled (e.g., at the high level) during the period of time substantially the same as the period of time during which the second pulse of the refresh signal REF is enabled (e.g., at the high level).

Because the refresh redundancy check operation required at the second pulse of the refresh signal REF may be performed at the first pulse of the refresh signal REF, the refresh redundancy check operation may not be required at the second pulse of the refresh signal REF, and thus the generation of the refresh redundancy check control pulse REF_RCT may be prevented at the second pulse of the refresh signal REF.

Figure 6:
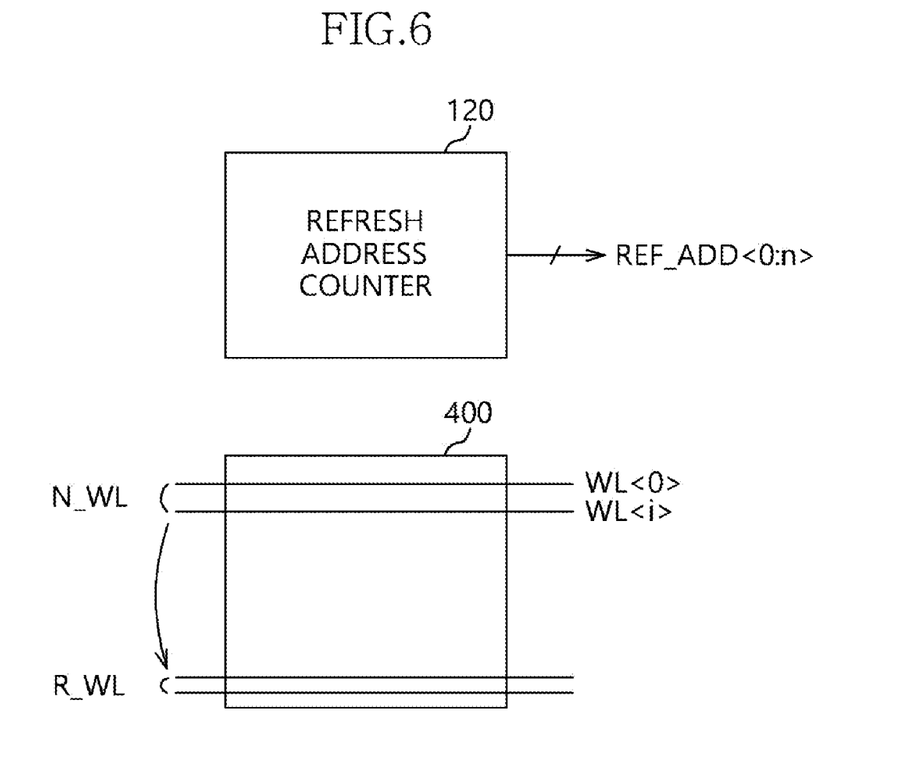
FIG. 6 is a diagram illustrating an example of a refresh method in accordance with example embodiments.

FIG. 6 is a diagram illustrating an example of a refresh method in accordance with example embodiments.

Referring to FIG. 6, the semiconductor memory device may replace an abnormal word line with a redundant word line. Here, the semiconductor memory device may replace a pair of the abnormal word lines with a pair of the redundant word lines instead of replacing a single abnormal word line with a single redundant word line.

The semiconductor memory device may include a data storage region 400. The data storage region 400 may include a plurality of normal word lines N_WL and a plurality of redundancy word lines R_WL.

When a pair of the normal word lines N_WL are replaced with a pair of the redundancy word lines R_WL, the pair of the normal word lines N_WL may include a first normal word line WL<0> and an $(i+1)^{th}$ normal word line WL<i>.

The semiconductor memory device may include the refresh address counter 120, which generates an address REF_ADD<0:n> of the normal word line in the refresh operation. When the refresh address counter 120 generates an address of the first normal word line WL<0>, the refresh address counter 120 may generate an address of the $(i+1)^{th}$ normal word line WL<i>.

When the semiconductor memory device replaces the pair of the normal word lines N_WL with the pair of the redundancy word lines R_WL, the first word line and a second word line may make a pair, and a third word line and a fourth word line may make a pair. Thus, when the addresses of the pair of the normal word lines N_WL may be increased by one, a counting value of the refresh address counter 120 may also be increased by one.

When the semiconductor memory device replaces the pair of the normal word lines N_WL with the pair of the redundancy word lines R_WL, the addresses of the pair of the normal word lines N_WL may be increased by two, and thus the counting value of the refresh address counter 120 may also be increased by two.

The addresses of the pair of the normal word lines may be sequentially counted to generate the two refresh redundancy check control pulses REF_RCT including the addresses of the pair of the normal word lines. The refresh redundancy check operation at the second pulse of the refresh signal REF may be omitted because it can be performed at the first pulse of the refresh signal REF. Thus, the refresh redundancy check control pulse REF_RCT may not be generated at the second pulse of the refresh signal REF. The row active pulse RACT_p may have the same window (i.e., the same pulse width) as that of the second pulse of the refresh signal REF. Therefore, the time it takes for the refresh operation at the second pulse of the refresh signal may be shorter than the time it takes for the refresh operation at the first pulse of the refresh signal.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A semiconductor memory device comprising:
    a row address generating circuit configured to generate a row address in response to a refresh command, a row active pulse, and a normal address;
    a row active pulse generating circuit configured to generate the row active pulse in response to a refresh signal in a refresh operation and generate the row active pulse in response to an active signal in a non-refresh operation; and
    a word line activating circuit configured to selectively enable a word line in response to the row address and the row active pulse.

2. The semiconductor memory device of claim 1, wherein the row address generating circuit outputs the normal address as the row address or a counted address as the row address in response to the refresh command.

3. The semiconductor memory device of claim 2, wherein the row address generating circuit comprises:
    a refresh signal generator configured to generate the refresh signal in response to the refresh command and the row active pulse;
    a refresh address counter configured to generate a refresh address by performing a counting operation in response to the refresh signal; and
    an address selector configured to output one of the refresh address and the normal address as the row address in response to the refresh command.

4. The semiconductor memory device of claim 3, wherein the refresh signal generator enables the refresh signal in response to the refresh command and disables the refresh signal in response to the row active pulse.

5. The semiconductor memory device of claim 3, wherein the semiconductor memory device replaces a pair of normal word lines with a pair of redundant word lines, and the refresh address counter sequentially counts addresses of the pair of the normal word lines.

6. The semiconductor memory device of claim 3, wherein the address selector outputs the refresh address as the row address in response to the refresh command during the refresh operation, and outputs the normal address as the row address in response to the refresh command during the non-refresh operation.

7. The semiconductor memory device of claim 1, wherein, when a first pulse of the refresh signal is enabled in the refresh operation, the row active pulse generating circuit generates the row active pulse after a predetermined time interval from the generation of the first pulse of the refresh signal, the row active pulse generating circuit generates the row active pulse just when a second pulse of the refresh signal is enabled in the refresh operation, and the row active pulse-generating circuit generates the row active pulse in response to the active signal when the refresh signal is primarily enabled in the non-refresh operation.

8. The semiconductor memory device of claim 7, wherein the row active pulse generating circuit comprises:
    a refresh pulse generator configured to enable a refresh row active signal after a predetermined time interval from the generation of the first pulse of the refresh signal and to enable the refresh row active signal simultaneously when the second pulse of the refresh signal is enabled; and
    a row active pulse generator configured to generate the row active pulse in response to the refresh row active signal and the active signal.

9. The semiconductor memory device of claim 8, wherein the refresh pulse generator comprises:
    a refresh redundancy check pulse generator configured to refresh redundancy check pulse in response to the refresh signal;
    a refresh redundancy check pulse controller configured to generate a refresh redundancy check control pulse and a redundancy check enabling signal in response to the refresh redundancy check pulse; and
    a refresh row active pulse generator configured to the refresh row active signal in response to the refresh redundancy check control pulse and the redundancy check enabling signal.

10. The semiconductor memory device of claim 9, wherein the refresh check pulse generator consecutively generates two refresh redundancy check pulses when the refresh signal is enabled.

11. The semiconductor memory device of claim 9, wherein the refresh redundancy check pulse controller generates the redundancy check enabling signal in response to the refresh signal and generates the redundancy check control pulse in response to the refresh signal and the redundancy check enabling signal.

12. The semiconductor memory device of claim 11, wherein the refresh redundancy check pulse controller disables the enabled refresh check enabling signal when the first pulse of the refresh signal is enabled, the refresh redundancy check pulse controller enables the disabled refresh check enabling signal when the second pulse of the refresh signal is enabled, the refresh redundancy check pulse controller outputs the refresh redundancy check pulse as the refresh redundancy check control pulse during a period of time during which the refresh check enabling signal is enabled, and the refresh redundancy check pulse controller fixes the refresh redundancy check control pulse to a certain level when the refresh check enabling signal is disabled.

13. The semiconductor memory device of claim 9, wherein the refresh row active pulse generator enables the refresh row active signal when a predetermined number of pulses of the redundancy check control pulse are input by counting the refresh redundancy check control pulse during a period of time during which the redundancy check signal is enabled, and the refresh row active pulse generator enables the refresh row active signal when the refresh signal is enabled during a period of time during which the redundancy check signal is enabled.

14. The semiconductor memory device of claim 13, wherein the refresh row active pulse generator comprises:
    a counter configured to count the refresh redundancy check control pulse;

a multiplexer configured to output one of an output signal of the counter and the refresh signal as a selection signal in response to the redundancy check enabling signal; and a pulse generator configured to generate the refresh row active signal when the selection signal is enabled.

15. The semiconductor memory device of claim 1, wherein the word line activating circuit selectively enables a word line in response to the row address during a period of time during which the row active pulse is enabled.

16. A refresh method of a semiconductor memory device configured to replace a pair of normal word lines with a pair of redundant word lines and including a counter configured to sequentially count addresses of the pair of the normal word lines, the refresh method comprising:

enabling a first pulse of a refresh signal;

performing a refresh redundancy check with respect to the addresses of the pair of the normal word lines during a period of time during which the first pulse of the refresh signal is enabled;

performing a refresh operation during a remaining period of time during which the first pulse of the refresh signal is enabled, after performing the refresh redundancy check;

enabling a second pulse of the refresh signal; and performing a refresh operation without performing the refresh redundancy check during a period of time during which the second pulse of the refresh signal is enabled.

17. The method of claim 16, wherein performing a refresh operation without performing the refresh redundancy check includes performing the refresh operation in a period of time substantially the same as the period of time during which the second pulse of the refresh signal is enabled.

18. The method of claim 16, wherein each of the first and second pulses of the refresh signal is a relatively wide pulse compared to a period of time for the refresh redundancy check and a period of time for the refresh operation, and the first and second pulses of the refresh signal are consecutively generated.

* * * * *